(12) United States Patent
Do et al.

(10) Patent No.: US 9,077,284 B2
(45) Date of Patent: Jul. 7, 2015

(54) ABSORPTIVE RF RECTIFIER CIRCUIT

(71) Applicant: Werlatone, Inc., Brewster, NY (US)

(72) Inventors: Ky-Hien Do, Mississauga (CA); Peter Kuring, New Milford, CT (US)

(73) Assignee: Werlatone, Inc., Patterson, NY (US)

( * ) Notice: Subject to any disclaimer, the term of this patent is extended or adjusted under 35 U.S.C. 154(b) by 183 days.

(21) Appl. No.: 13/927,800

(22) Filed: Jun. 26, 2013

(65) Prior Publication Data

US 2015/0003131 A1    Jan. 1, 2015

(51) Int. Cl.
*H02M 7/06*  (2006.01)
*H03F 1/00*  (2006.01)

(52) U.S. Cl.
CPC ........................................ *H03F 1/00* (2013.01)

(58) Field of Classification Search
CPC ......... H02M 3/07; H02M 6/103; H02M 7/06; H02M 3/33592; H01L 25/01
USPC ....................... 363/60, 61, 123, 125, 126, 127
See application file for complete search history.

(56) References Cited

U.S. PATENT DOCUMENTS

| | | | |
|---|---|---|---|
| 3,564,456 A * | 2/1971 | Denny, Jr. | .................... 332/136 |
| 3,638,134 A | 1/1972 | Beurrier et al. | |
| 3,671,884 A * | 6/1972 | Denny, Jr. | .................... 330/302 |
| 3,760,257 A | 9/1973 | Fletcher et al. | |
| 3,790,904 A | 2/1974 | Lesyk et al. | |
| 3,852,755 A | 12/1974 | Works et al. | |
| 3,859,609 A | 1/1975 | Couvillon et al. | |
| 3,922,685 A | 11/1975 | Opas | |
| 4,321,527 A | 3/1982 | Ho | |
| 4,360,741 A | 11/1982 | Fitzsimmons et al. | |
| 4,393,441 A * | 7/1983 | Enge | ............................... 363/61 |
| 4,432,015 A * | 2/1984 | Lambert et al. | ............... 348/706 |
| 4,486,722 A | 12/1984 | Landt | |
| 4,564,843 A | 1/1986 | Cooper | |
| 4,594,557 A | 6/1986 | Shillady | |
| 4,685,047 A | 8/1987 | Phillips, Sr. | |
| 4,701,716 A | 10/1987 | Poole | |
| 4,701,732 A | 10/1987 | Nestlerode | |
| 5,014,018 A | 5/1991 | Rodwell et al. | |
| 5,087,893 A * | 2/1992 | Petersen et al. | ............... 330/296 |

(Continued)

OTHER PUBLICATIONS

Devlin et al., "MMICs for Broadband Receiver Applications," Design of RFIC's and MMIC's, 1997, 12 pages, vol. 391, IEE Tutorial Colloquium, London.

(Continued)

*Primary Examiner* — Adolf Berhane
(74) *Attorney, Agent, or Firm* — Kolisch Hartwell, P.C.

(57) ABSTRACT

A radio frequency rectifier circuit may include a resistive termination to circuit ground, a plurality of inductors, and at least a first pair of rectifier components. The plurality of inductors may be connected electrically in series between an input node for receiving an input RF signal and the resistive termination. Each pair of electrically adjacent inductors of the plurality of inductors may be connected together at a respective in-line node. The first pair of rectifier components may electrically couple a first one of the in-line nodes to a respective direct current output node. Each rectifier component may have a cathode and an anode. A first rectifier component of the first pair of rectifier components may have the cathode electrically connected to the first in-line node and a second rectifier component of the first pair of rectifier components may have the anode electrically connected to the first in-line node.

10 Claims, 5 Drawing Sheets

(56) References Cited

U.S. PATENT DOCUMENTS

| | | | |
|---|---|---|---|
| 5,101,171 A | 3/1992 | Redmond | |
| 5,230,090 A | 7/1993 | Zametzer et al. | |
| 5,341,114 A | 8/1994 | Calviello et al. | |
| 5,414,313 A * | 5/1995 | Crescenzi et al. | 327/351 |
| 5,559,402 A | 9/1996 | Corrigan, III | |
| 5,568,088 A | 10/1996 | Dent et al. | |
| 5,574,697 A | 11/1996 | Manning | |
| 5,631,604 A | 5/1997 | Dent et al. | |
| 5,638,024 A | 6/1997 | Dent et al. | |
| 5,771,444 A | 6/1998 | Dent et al. | |
| 5,818,298 A | 10/1998 | Dent et al. | |
| 5,842,140 A | 11/1998 | Dent et al. | |
| 5,892,395 A | 4/1999 | Stengel et al. | |
| 6,054,894 A | 4/2000 | Wright et al. | |
| 6,297,696 B1 | 10/2001 | Abdollahian et al. | |
| 6,361,207 B1 | 3/2002 | Ferguson | |
| 6,768,380 B2 | 7/2004 | Hong et al. | |
| 6,853,264 B2 | 2/2005 | Bennett et al. | |
| 7,180,392 B2 | 2/2007 | Grothen et al. | |
| 7,202,734 B1 * | 4/2007 | Raab | 330/126 |
| 7,385,456 B2 | 6/2008 | Heston et al. | |
| 8,049,558 B2 | 11/2011 | Wyse et al. | |
| 8,076,975 B1 | 12/2011 | Lender, Jr. et al. | |
| 8,126,410 B2 | 2/2012 | Alon et al. | |
| 8,175,555 B2 | 5/2012 | Chi | |
| 2002/0180552 A1 | 12/2002 | Bennett et al. | |
| 2009/0108965 A1 | 4/2009 | Fuentes | |
| 2013/0343106 A1 * | 12/2013 | Perreault et al. | 363/67 |

OTHER PUBLICATIONS

Jacobs, Ira; "The Nonuniform Transmission Line as a Broadband Termination"; The Bell System Technical Journal; Dec. 17, 1957; 12 pages.

* cited by examiner

ABSORPTIVE RF RECTIFIER CIRCUIT

BACKGROUND OF THE DISCLOSURE

A rectifier circuit is described that converts a radio-frequency (RF) alternating current (AC) electrical energy into direct current (DC) energy. The RF-DC rectifier circuit accepts RF energy as an input signal and generates a DC signal. At low power or in linear operations, a rectifier circuit can be used as a detector for the purpose of accurately quantifying the strength level of a RF signal. At high power or in nonlinear operations, a rectifier circuit can be used as a RF-DC converter for the purpose of converting the RF signal to a DC signal efficiently.

Rectifier circuits may be used to recover wasted energies that otherwise would be terminated in resistive dummy loads employed, for example, in combiners of power amplifiers. This is done by replacing the resistive dummy loads with reflective rectifier circuits. Such circuits may have narrow band responses and tend to reflect signals outside of the narrow band. Such circuits can inject self-generated harmonic or inter-modulation products back into an external input circuit, such as power amplifiers.

Artificial transmission lines may employ diodes as shunt elements for use in various low-energy applications, including video detectors, RF digital pulse fall-time compression circuits, and voltage clippers.

BRIEF SUMMARY OF THE DISCLOSURE

In some examples, a RF rectifier circuit may include a resistive termination to circuit ground, a plurality of inductors, and at least a first pair of rectifier components. The plurality of inductors may be connected electrically in series between an input node for receiving an input RF signal and the resistive termination. Each pair of electrically adjacent inductors of the plurality of inductors may be connected together at a respective in-line node. The first pair of rectifier components may electrically couple a first one of the in-line nodes to a respective direct current (DC) output node. Each rectifier component may have a cathode and an anode. A first rectifier component of the first pair of rectifier components may have the cathode electrically connected to the first in-line node and a second rectifier component of the first pair of rectifier components may have the anode electrically connected to the first in-line node.

In some examples, the plurality of inductors may include a terminal inductor electrically connected to the resistive termination at a further in-line node, with a respective pair of the rectifier components electrically coupling each of the in-line nodes to respective ones of the DC output nodes.

DESCRIPTION OF EMBODIMENTS

In many RF sub-systems, there are instances and locations where resistive dummy loads are employed to terminate unwanted energies. As a general rule, the resistive dummy loads are broadband passive devices, such as simple resistors. These dummy loads may be replaced with rectifier circuits that recover the terminated RF energies. Adverse effects of the rectifier circuits may be reduced by using a rectifier circuit that has low return losses. The lower the return losses the more closely the rectifier circuits imitate the behavior of the resistive loads they replace. In other words, the rectifier circuits will more closely function like the resistive dummy loads they replace if they possess an absorptive nature over a wide bandwidth for the power levels of interest.

As such, the operations of rectifier-deployed amplifier systems may not need to be altered from those that employ purely resistive terminations. Because of this absorptive nature of some examples of rectifier circuits, any harmonics or inter-modulation products generated by the rectifier circuits may not be back injected into the amplifier systems. Furthermore, the higher the RF-to-DC conversion efficiency of the rectifier circuits the more energy is recovered for other uses and thermal dissipation may be reduced.

Figure 1:
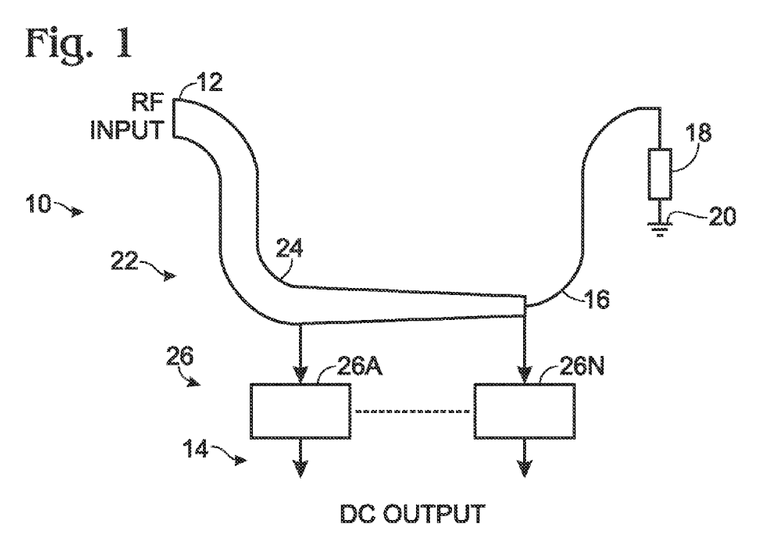
FIG. 1 is a functional block diagram of an example of a rectifier circuit.

FIG. 1 shows a functional block diagram of a generalized absorptive rectifier circuit 10. A RF input node or port 12 is shown on the top left of the diagram. DC output nodes or ports 14 are on the bottom of the diagram, and an RF termination port 16 is on the top right. A resistive RF termination 18 is connected between RF termination port 16 and circuit ground 20. The terms port and node may be used interchangeably. Either term is intended to indicate a position in the circuit where characteristics of the circuit may be identified, whether or not the position is conveniently accessible in a particular embodiment.

Rectifier circuit 10 may include a transmission line 22 extending from input port 12 to the RF termination port 16. The transmission line includes a series conductor 24 having a width at any point that represents the relative general RF energy being conducted by the transmission line at that point. As seen in FIG. 1, the RF energy is strongest when it enters the RF input port. The width of the transmission line conductor is therefore widest at this location. An absorptive rectifier circuit, belonging to this class, may be constructed in a way that guides the RF energy from the RF input to the DC ports, through multiple parallel RF-DC converters 26. In this example, representative initial converter 26A and final converter 26N are illustrated with additional intermediate converters being included as appropriate. In the general case, N may be any suitable positive integer.

Reflected energy associated with the operations of the RF-DC converters is preferably guided toward the RF termination and not back to the RF input port. Transmission line 22 may be configured to impede the flow of energies reflected from RF-DC converters 26 back along transmission-line conductor 24 to the RF input port 12 by the properties of the transmission-line, formed between the RF input port and the RF termination. In this example, this directional characteristic is provided by making RF-DC converters 26 part of the transmission line. In other words, the RF-DC converters are embedded within the transmission-line, and may provide one or more characteristics of transmission line 22, such as:

a. having a low wideband return loss at the RF input port;
b. driving the RF-DC converters with equal voltages along the transmission line; and/or
c. absorbing RF energy through the RF-DC converters instead of conducting them to the RF termination.

Characteristic (a) corresponds to the rectifier circuit absorptive properties. The other two characteristics provide improved efficiency, thereby producing more useable DC energy.

In the example shown, as the RF energy travels along transmission-line conductor 24 across the row of one or more RF-DC converters 26, the RF energy reduces in magnitude as RF energy is being converted to DC energy. The transmission-line conductor is therefore shown with an idealized taper in width, from left to right, corresponding to continuous reduction in conducted energy. Where there are one or more distinct converters as shown, a more accurate representation of the width of the transmission-line energy flow would be stepped, with a stepped reduction at each RF-DC converter. At the last RF-DC converter sub-circuit, the power level is lowest. Ideally, beyond this point in the circuit, if the conversion efficiency were 100%, there should be no RF energy left. In reality, however, there is always some residual energy left over. The residual energy is preferably guided to the RF termination so that the residual energy is not reflected back to the input, as discussed above.

In normal operation, the residual energy reaching the RF termination is usually terminated by a resistive load. However, if desired, this energy can be sent to another rectifier circuit to extract more DC power. Also, as will be described with reference to FIG. 2, the DC outputs of like voltage polarity from the RF-DC converters may be connected together to form a combined DC output port.

As discussed, rectifier circuit 10 may provide an absorptive property by embedding RF-DC converters, which in one example may be rectifying components such as diodes or diode-like elements, in transmission line 22 for the purpose of absorbing the capacitive and resistive parasitics of the RF-DC converters into the transmission line. As discussed below with reference to the embodiment of a rectifier circuit illustrated in FIG. 2, absorptive rectifier circuits may be constructed in a manner that allows them to handle broadband and high power RF signals, with high efficiency and with low return loss.

In a further example, an absorptive rectifier circuit may include a network of rectifying components arranged in a fishbone topology. The network of rectifying components may be comprised of a sequence of non-uniform discrete inductors, with the inductance values arranged in an ascending order from the input to the output. In other examples, the inductance values may be equal, or may vary in other ways. An in-line node connecting two adjacent discrete inductors may be loaded with a pair of rectifying components to form a transmission-line sub-section, capable of full-wave rectification. Plural sub-sections may be utilized to form a fishbone-like circuit structure appropriate to a particular broad bandwidth requirement.

The rectifying components may be in the form of rectifying elements each having an anode and a cathode. The cathode of a first one of a pair of rectifying elements and the anode of the second of the pair of rectifying elements may be attached to an in-line node connecting two adjacent inductors, to form two sides of a fishbone sub-section. In some examples, the anode of the first rectifying element and the cathode of the second rectifying element each may be connected to a respective parallel RC circuit to smooth out the rectified signal. One RC circuit may serve a plurality of RF-DC converters or plural RC circuits may be provided. The anodes of all first rectifying elements may be connected together to form a negative DC rail, whereas the cathodes of all second rectifying elements may be connected together to form a positive DC rail. The negative and positive DC rails may be further combined to form a single DC output port.

Figure 2:
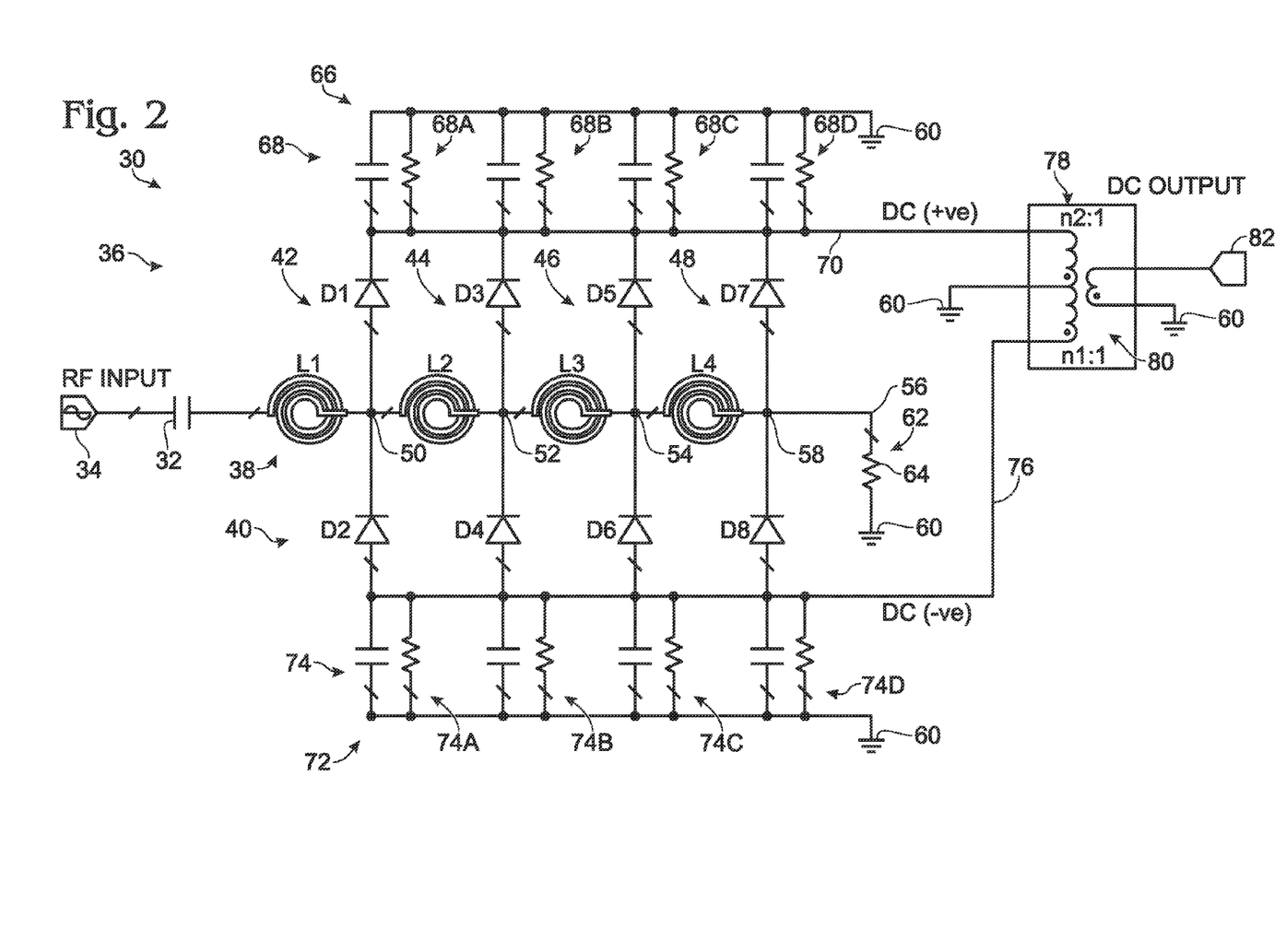
FIG. 2 is a circuit schematic of one example of a transmission-line rectifier circuit.

FIG. 2 is a circuit schematic of a first detailed embodiment of an absorptive rectifier circuit 30 belonging to the class of circuits illustrated in FIG. 1. Some examples of the rectifier circuit of FIG. 2 may provide high-efficiency and a broadband absorptive rectifier circuit realization, which may be used to recover wasted energies that would otherwise be dissipated by resistive terminations.

In this embodiment, a DC-blocking capacitor 32 connects an RF input node or port 34 to a nonlinear non-uniform artificial transmission line 36. Transmission line 36 may include series connected inductors 38, including individual inductors L1-L4. The transmission line also may include RF-DC converters 40 including rectifier components in the form of individual diodes D1-D8. Inductor L1 and diodes D1 and D2 form a first sub-section 42 of the artificial transmission line. Similarly, inductor L2 and diodes D3 and D4 form second sub-section 44. Inductor L3 and diodes D5 and D6 form third sub-section 46, and inductor L4 and diodes D7 and D8 form the fourth and last subsection 48.

An in-line node 50 connects inductors L1 and L2, an in-line node 52 connects inductors L2 and L3, and an in-line node 54 connects inductors L3 and L4. The right side of inductor L4, the terminal inductor next to the termination in this example, connects to a resistive termination terminal 56 that is also an in-line node 58. Terminal 56 is connected to circuit ground 60 through a resistive termination 62 in the form of a resistor 64.

The cathodes of diodes D1, D3, D5 and D7 are connected to a voltage leveling circuit 66. In this example, voltage leveling circuit 66 includes at least one parallel resistor and capacitor (RC) circuit, and preferably a bank or plurality of parallel RC circuits 68. One RC circuit is connected between each diode and circuit ground 60. Specifically, a RC circuit 68A couples the cathode of diode D1 to circuit ground. Similarly, RC circuits 68B, 68C, and 68D couple respective diodes D3, D5, and D7 to ground. These cathodes may be connected together to form a positive DC output rail 70, an end of which may also be considered an output DC node or port.

Correspondingly, the anodes of diodes D2, D4, D6 and D8 are connected to another voltage leveling circuit 72 including a bank of parallel RC circuits 74. Specifically, RC circuits 74A, 74B, 74C, and 74D couple respective diodes D2, D4, D6, and D8 to ground 60. The anodes of these diodes also may be connected together to form a negative DC output rail 76.

The positive and negative DC output rails 70, 76 may provide separate positive and negative voltage supplies, or they may be combined together by a DC combiner circuit 78, such as a transformer 80, to form a single positive or negative voltage supply on a DC output node 82.

The cascaded connection of the four sub-sections resembles a fishbone structure, with the input port forming the head, the resistive termination the tail, and the opposing diode pairs the ribs.

Continuing to refer to FIG. 2, as a sinusoidal signal enters the RF input port 34, a portion of the RF energy is rectified by the first fishbone sub-section 42, formed by inductor L1 and diodes D1 and D2. In this first sub-section, diode D1 is responsible for rectifying the positive half of the sinusoidal signal, whereas diode D2 the negative half. The RC circuits 68A and 74A, attached respectively to diodes D1 and D2, are responsible for smoothing out the ripples due to the rectification process. The remainder of the RF input signal continues to travel through the remaining sub-sections 44, 46, and 48 where the remaining signal is processed in a similar manner, thereby extracting most of the available energy from the RF signal as DC energy.

As described in FIG. 1, the RF energy diminishes in magnitude as it travels from the input to the termination. As such, typically, if the artificial transmission line is made with equal values of discrete inductances as in the case of a uniform transmission line, a higher voltage is applied to the diode pair of D1 and D2 than the other three pairs. In other words, if the artificial transmission line is made uniform, the diode pairs are operating at unequal drive voltages. The unequal drive levels cause the earlier diode pairs to work harder than the subsequent pairs, because the nonlinear operation of a diode is a direct function of its drive voltage. In summary, when the artificial transmission line is designed to be uniform, not all the diode pairs contribute equally to the task of converting RF energy to DC power since the diodes are driven with different voltages. As a result, a uniform design of a nonlinear transmission line is not as efficient as if the diode pairs are driven equally.

FIG. 2 depicts a four sub-section artificial transmission line for the purpose of illustrating the fishbone topology of a high-efficiency rectifier circuit. In practice, more sub-sections can be used if a wider bandwidth is required, according to the theory of distributed design. Furthermore, in this embodiment even though a diode is used to represent a rectifying element or rectifying component for the RF-DC converter, in practice, any device capable of performing the rectification process can be used. In other words, the rectifying circuit illustrated in FIG. 2 is a specific example and is not intended to limit the implementation of rectifying circuits.

Figure 3:
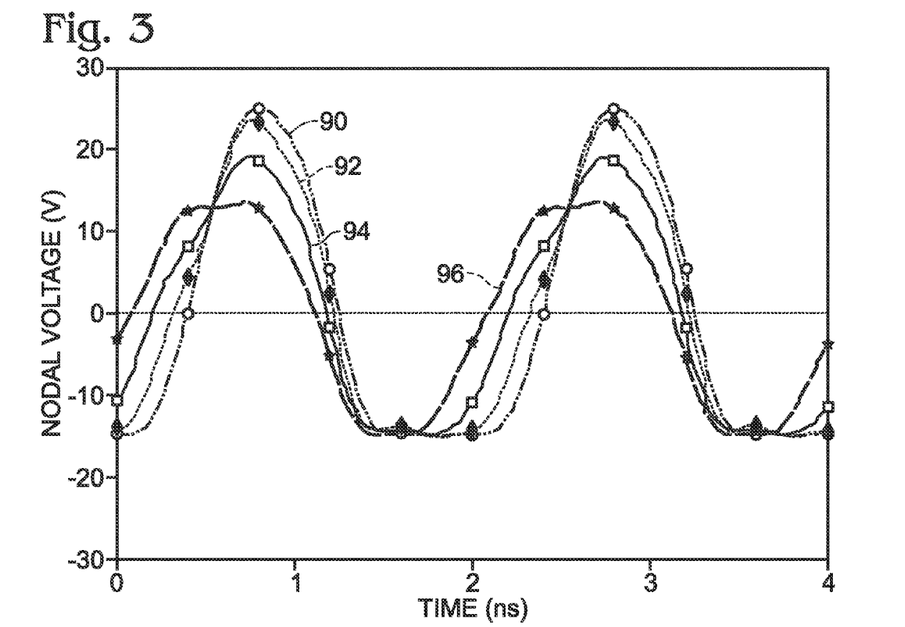
FIG. 3 is a chart illustrating nodal voltages along the transmission line of one example of the rectifier circuit of FIG. 2.

FIG. 3 shows simulation results of a uniform nonlinear transmission line rectifier circuit. In this figure, the nodal voltage levels at the four in-line nodes, to which the diode pairs are attached, are displayed. The voltage curve 90 indicated by the dash-double-dot line and circle symbol corresponds to the voltage at node 50, the curve 92 indicated by the dashed line and diamond symbol corresponds to the voltage at node 52, the curve 94 indicated by the solid line and square symbol corresponds to the voltage at node 54, and the curve 96 indicated by the dashed line and star symbol corresponds to the voltage at node 58. As can be seen, the drive voltages at the four nodes are very unequal, signifying the fact that the diode pairs are operating at different efficiency levels.

To improve the circuit efficiency, the rectifier circuit 30 may have varying inductances, with the inductances having the relationship L1<L2<L3<L4. As a result, artificial transmission line 36 is non-uniform with the impedance values increasing from the input to the termination. As a result, the first diode pair D1 and D2 in subsystem 42 receives more RF power but at a lower impedance level than the subsequent pairs. The second diode pair D3 and D4 in subsystem 44 receives less RF power than the first but at a higher impedance level. A similar condition is experienced by the next two diode pairs, pair D5, D6 in subsystem 46 and pair D7, D8 in subsystem 48. Then, the impedance profile of the resulting non-uniform artificial transmission line 36 may be set so that the voltage drives impressed upon all of the diode pairs are equal, despite the unequal RF power levels. By driving the diode pairs at the same voltage level, the combination of subsystems may provide high RF-DC conversion efficiency.

Figure 4:
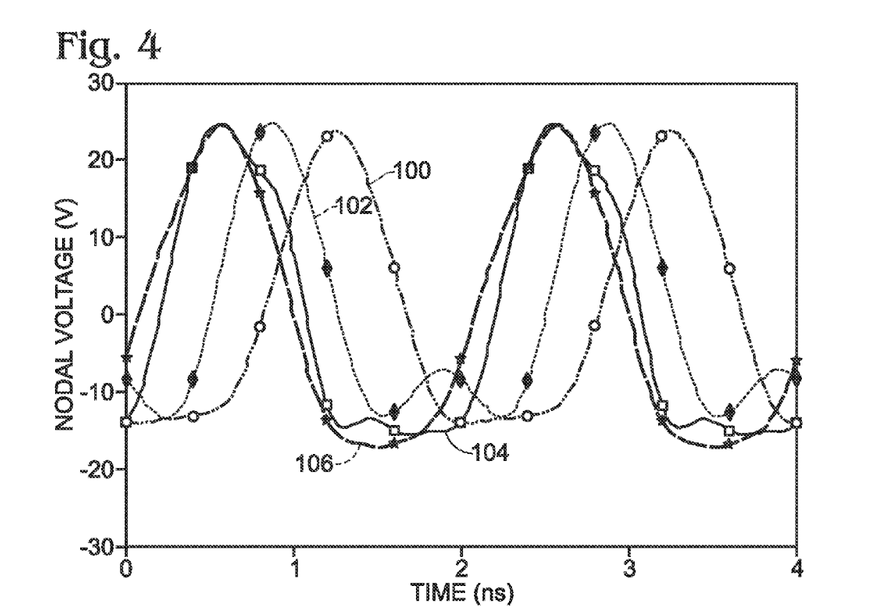
FIG. 4 is a chart illustrating nodal voltages along the transmission line of another example of the rectifier circuit of FIG. 2.

FIG. 4 shows simulation results of such a non-uniform nonlinear transmission line rectifier circuit 36. The nodal voltage levels at the four nodes, to which the diode pairs are attached, are displayed. Similar to FIG. 3, the voltage curve 100 indicated by the dash-double-dot line and circle symbol corresponds to the voltage at node 50, the curve 102 indicated by the dashed line and diamond symbol corresponds to the voltage at node 52, the curve 104 indicated by the solid line and square symbol corresponds to the voltage at node 54, and the curve 106 indicated by the dashed line and star symbol corresponds to the voltage at node 58. As can be seen, the drive voltages at the four nodes are substantially equalized, indicating that the diode pairs are operating at a similar efficiency level. As a result, the overall efficiency of this non-uniform design can be designed to be higher than that for the uniform design.

Two nonlinear simulations were performed in the Microwave Office® computer application using a harmonic balance engine to validate the proposed fishbone nonlinear nonuniform transmission line topology. The first simulation employs the nonlinear SPICE model parameters of Avago Technologies' HSMS-2810 Schottky diodes, whose breakdown voltage is 20 volts, to realize a design of a 5-watt fishbone rectifier circuit. The second simulation employs the nonlinear SPICE model parameters of the HSMS-2800 Schottky diodes, whose breakdown voltage is 70 volts, to realize a 100-watt fishbone rectifier circuit.

Figure 5:
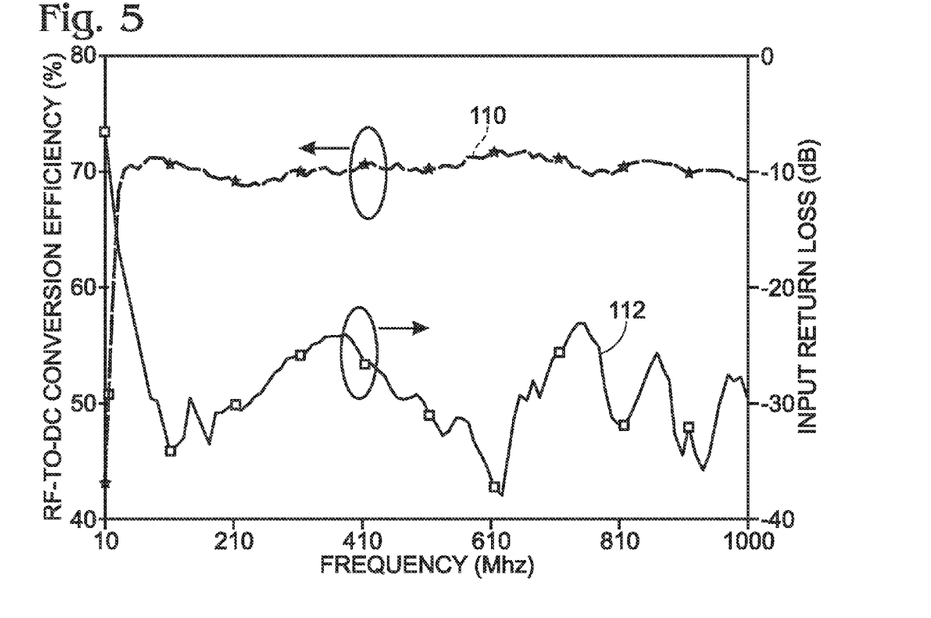
FIG. 5 is a chart illustrating simulated RF-to-DC conversion efficiency and input return loss of an example of a 5-watt rectifier circuit.

FIG. 5 is a chart illustrating simulation results of the 5-watt fishbone rectifier circuit. The simulated RF-DC conversion efficiency, shown by curve 110, of the 5-watt fishbone rectifier circuit is 70% across the frequency band covering 30 MHz to 1000 MHz, at an input drive of 5 watts. The efficiency of this circuit tapers down to 60% at 1500 MHz. This circuit employs a nonuniform inductance profile, in which the inductance value increases monotonically from 1 nH to 90 nH, to accomplish the high efficiency. The input return loss of the circuit, represented by curve 112, is better than 23 dB from 30 MHz to well beyond 1000 MHz.

Figure 6:
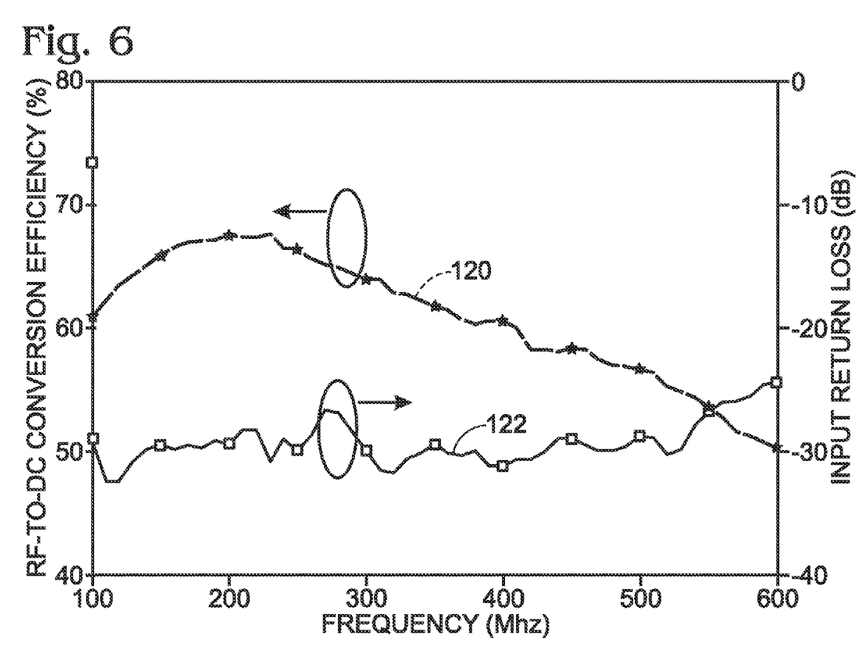
FIG. 6 is a chart illustrating simulated RF-to-DC conversion efficiency and input return loss of an example of a 100-watt rectifier circuit.

FIG. 6 is a similar chart illustrating simulation results of the 100-watt fishbone rectifier circuit. The simulated RF-DC conversion efficiency, shown by curve 120, starts at 60% at 100 MHz and rolls down to 50% at 600 MHz, at an input drive of 100 watts. This circuit employs a nonuniform inductance profile, in which the inductance value increases monotonically from 4 nH to 184 nH, to accomplish the high efficiency. The input return loss of the circuit, shown by curve 122, is better than 23 dB from 100 MHz to 600 MHz.

A third simulation was performed that employed the nonlinear SPICE model parameters of Aeroflex-Metelics MGRS221 GaAs Schottky diodes, whose breakdown voltage is 22 volts, to realize another design of a 5-watt fishbone rectifier circuit. A fourth simulation employed the nonlinear SPICE model parameters of the Aeroflex-Metelics MGRS501 GaAs Schottky diodes, whose breakdown voltage is more than 50 volts, to realize another 100-watt fishbone rectifier circuit. The results of these simulations are not illustrated, but the simulated results of the absorptive 5-watt GaAs diode rectifier circuit indicate a RF-DC conversion efficiency of 85% over a bandwidth spanning from 40 MHz to 2000 MHz. The simulated results of the absorptive 100-watt GaAs diode rectifier circuit indicate a RF-DC conversion efficiency of 80% over a bandwidth spanning from 100 MHz to 1200 MHz.

The simulated results of these four designs demonstrate the broadband and high-efficiency attributes of the fishbone rectifier circuit topology. The fishbone rectifier circuit topology delivers both bandwidth and efficiency simultaneously, along with an excellent return loss performance (absorptive property) over a very wide bandwidth of interest.

Furthermore, even though diodes are used in the simulations to demonstrate the novel and useful attributes of the fishbone rectifier circuit, other rectifying elements such as vacuum-based or transistor-based devices may be used. The fishbone topology permits the deployment of any rectifying element, preferably with the parasitic capacitance absorbed into the formation of an artificial transmission line.

Figure 7:
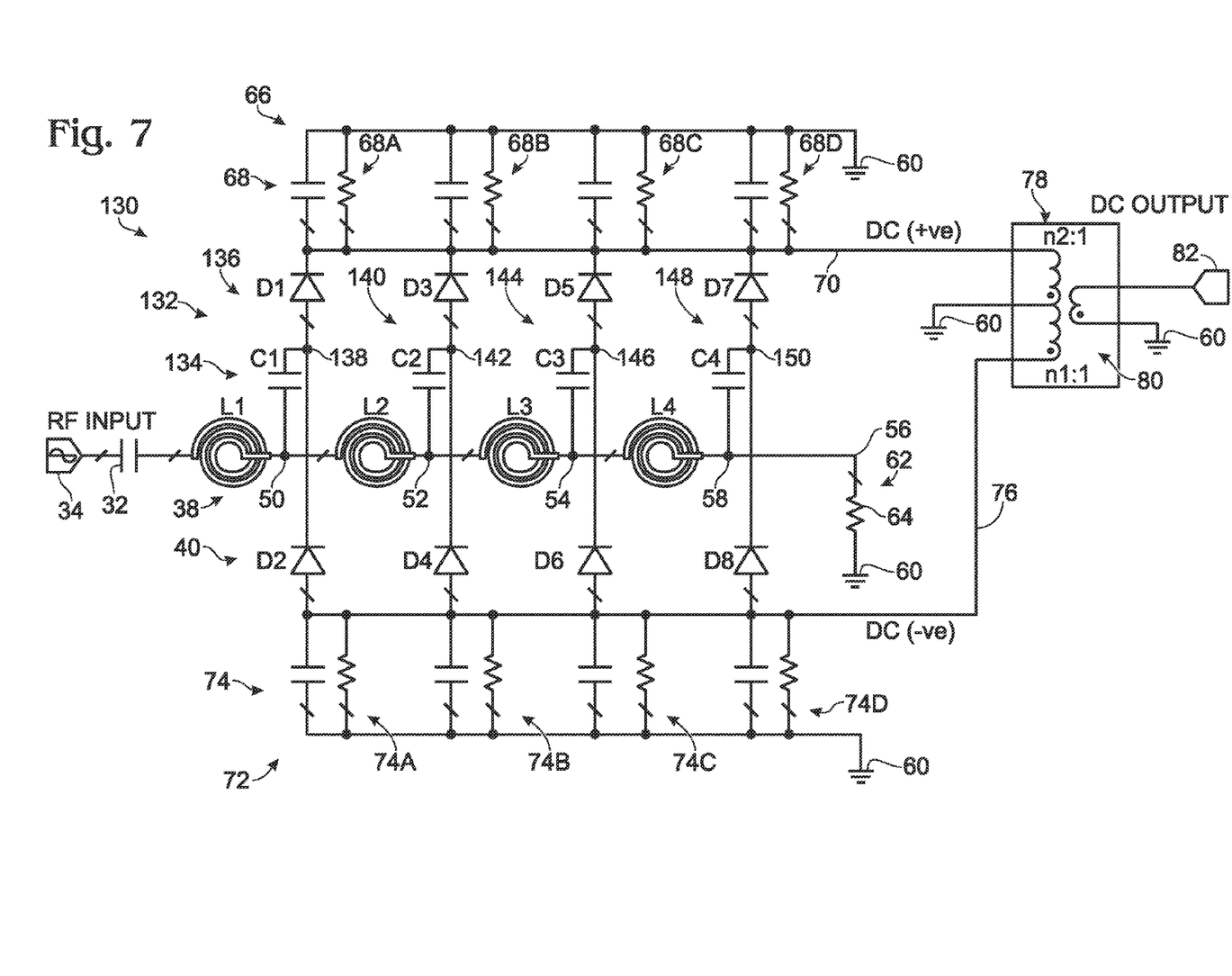
FIG. 7 is a circuit schematic of another example of a transmission-line rectifier circuit.

FIG. 7 shows a second embodiment of a nonlinear nonuniform transmission line rectifier circuit 130, belonging to the class of circuit described in FIG. 1. Many of the components and associated circuit configurations illustrated and described for rectifier circuit 30 of FIG. 2 are also incorporated in rectifier circuit 130. To simplify the discussion of rectifier circuit 130, like components are assigned the same reference numbers, it being understood that the description given above for rectifier circuit 30 is also applicable to rectifier circuit 130 other than the differences described below.

Rectifier circuit 130 includes a transmission line 132 that differs from transmission line 36. Transmission line 132 includes non-uniform inductors 38 and RF-DC converters 40. However, a capacitive voltage divider 134 is employed at each fishbone sub-section to further enhance the voltage equalization process. In this example, a transmission-line subsection 136 includes a capacitor C1 connected between in-line node 50 and an intermediate node 138 connecting the anode of diode D1 with the cathode of diode D2. The diode pair is thus not connected directly to node 50 as was the case with rectifier circuit 30. Similarly, in a transmission line subsection 140, diodes D3 and D4 are similarly connected to common intermediate node 142, and a capacitor C2 is connected between in-line node 52 and intermediate node 142; in a transmission line subsection 144, diodes D5 and D6 are similarly connected to common intermediate node 146, and a capacitor C3 is connected between in-line node 54 and intermediate node 146; and in a transmission line subsection 148, diodes D7 and D8 are similarly connected to common intermediate node 150, and a capacitor C4 is connected between in-line node 58 and intermediate node 150.

Each diode pair is thus fed by a different series capacitor to manipulate the voltage impressed upon the pair. The respective voltage-divider capacitor supplements the associated non-uniform inductor in equalizing the voltage at each transmission-line subsection. The values of the voltage-divider capacitors are designed to satisfy the condition of C1<C2<C3<C4 to provide that less voltage dividing is accomplished at the later stages. With the aid of these capacitors, the impedance values of inductors L1, L2, L3, and L4 may be less disparate thus rendering the design more wideband and more realizable.

It will be appreciated that the foregoing embodiments disclose that a RF rectifier circuit may include a resistive termination to circuit ground, a plurality of inductors, and at least a first pair of rectifier components. The plurality of inductors may be connected electrically in series between an input node for receiving an input RF signal and the resistive termination. Each pair of electrically adjacent inductors of the plurality of inductors may be connected together at a respective in-line node. The first pair of rectifier components may electrically couple a first one of the in-line nodes to a respective direct current (DC) output node. Each rectifier component may have a cathode and an anode. A first rectifier component of the first pair of rectifier components may have the cathode electrically connected to the first in-line node and a second rectifier component of the first pair of rectifier components may have the anode electrically connected to the first in-line node.

Inductances of the plurality of inductors may increase successively from the input node to the resistive termination. In some examples, inductances of the plurality of inductors may be set to apply substantially uniform voltages across each of the rectifier components.

The plurality of inductors may include a terminal inductor electrically connected to the resistive termination at a further in-line node. The rectifier circuit may further include a respective pair of the rectifier components electrically coupling each of the in-line nodes to respective ones of the DC output nodes. One rectifier component of each pair of the rectifier components may have the cathode electrically connected to the associated in-line node and the other of the rectifier components of each pair of rectifier components may have the anode electrically connected to the associated in-line node.

A voltage leveling circuit may couple at least one DC output node to circuit ground for reducing ripple in the output DC voltage. Each voltage leveling circuit may include an electrically parallel combination of a resistor and a capacitor coupling each rectifier component to circuit ground.

The inductors and rectifier components of a rectifier circuit may be selected to provide substantially uniform input impedance for the RF rectifier circuit over an operating bandwidth of at least an octave, or in some examples, at least a decade. A respective capacitor may be connected between each pair of rectifier components and the respective in-line node.

The above descriptions are intended to be illustrative and not restrictive. Many other embodiments will be apparent to those skilled in the art, upon reviewing the above description. The scope of the inventions should therefore be determined with reference to the appended claims, along with the full scope of equivalents to which such claims are entitled. Accordingly, while two embodiments of a fishbone rectifier circuit have been particularly shown and described, many variations may be made therein. This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure.

An appreciation of the availability or significance of claims not presently claimed may not be presently realized. Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated. Ordinal indicators may be applied to associated elements in the order in which they are introduced in a given context, and the ordinal indicators for such elements may be different in different contexts.

What is claimed is:

1. A radio-frequency (RF) rectifier circuit comprising:
a resistive RF termination to circuit ground;
a plurality of inductors connected electrically in series between an input node for receiving an input RF signal and the resistive RF termination, each pair of electrically adjacent inductors of the plurality of inductors being connected together at a respective in-line node; and
a plurality of rectifier components including a first pair of rectifier components, each rectifier component of the first pair of rectifier components electrically coupling of a first one of the in-line nodes to a respective direct current (DC) output node, each rectifier component having a cathode and an anode, a first rectifier component of the first pair of rectifier components having the cathode electrically connected to the first in-line node and a second rectifier component of the first pair of rectifier components having the anode electrically connected to the first in-line node, each DC output node being electrically separated from the resistive RF termination by at least a respective one of the plurality of rectifier components.

2. The RF rectifier circuit of claim 1, wherein inductances of the plurality of inductors increase successively from the input node to the resistive termination.

3. The RF rectifier circuit of claim 2, wherein inductances of the plurality of inductors are set to apply substantially uniform voltages across each of the rectifier components.

4. A radio-frequency (RF) rectifier circuit comprising:
a resistive termination to circuit ground;
a plurality of inductors connected electrically in series between an input node for receiving an input RF signal and the resistive termination, each pair of electrically adjacent inductors of the plurality of inductors being connected together at a respective in-line node the plurality of inductors including a terminal inductor electrically connected to the resistive termination at a further in-line node; and
each rectifier component of a respective pair of rectifier components electrically coupling each of the in-line nodes to a respective direct current (DC) output node, one rectifier component of each pair of the rectifier components having the cathode electrically connected to the associated in-line node and the other of the rectifier components of each pair of rectifier components having the anode electrically connected to the associated in-line node.

5. The RF rectifier circuit of claim 4, further comprising a voltage leveling circuit coupling at least one DC output node to circuit ground for reducing ripple in the output DC voltage.

6. The RF rectifier circuit of claim 5, wherein each voltage leveling circuit includes an electrically parallel combination of a resistor and a capacitor coupling each rectifier component to circuit ground.

7. The RF rectifier circuit of claim 4, wherein the inductors and rectifier components are selected to provide substantially uniform input impedance for the RF rectifier circuit over an operating bandwidth of at least an octave.

8. The RF rectifier circuit of claim 4, wherein the inductors and rectifier components are selected to provide substantially uniform input impedance for the RF rectifier circuit over an operating bandwidth of at least a decade.

9. The RF rectifier circuit of claim 4, further comprising a respective capacitor connected between each pair of rectifier components and the respective in-line node.

10. The RF rectifier circuit of claim 1, further comprising a capacitor connected between the pair of rectifier components and the in-line node.

* * * * *